United States Patent
Korevaar et al.

(10) Patent No.: US 8,119,513 B1
(45) Date of Patent: Feb. 21, 2012

(54) METHOD FOR MAKING CADMIUM SULFIDE LAYER

(75) Inventors: Bastiaan Arie Korevaar, Schenectady, NY (US); Scott Feldman-Peabody, Golden, CO (US); Robert Dwayne Gossman, Aurora, CO (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/951,108

(22) Filed: Nov. 22, 2010

(51) Int. Cl.
*H01L 21/28* (2006.01)
*H01L 21/3205* (2006.01)

(52) U.S. Cl. ............... 438/603; 438/86; 257/E29.099; 257/E21.543; 257/E21.603; 257/78

(58) Field of Classification Search .......... 483/85, 483/86, 603; 257/78, E29.099, E21.543, 257/E21.603
See application file for complete search history.

(56) References Cited

U.S. PATENT DOCUMENTS

| | | | | |
|---|---|---|---|---|
| 4,025,339 A * | 5/1977 | Kuehnle | ......... | 430/63 |
| 4,035,819 A | 7/1977 | Nitta et al. | | |
| 4,041,140 A | 8/1977 | Nitta et al. | | |
| 4,178,395 A * | 12/1979 | Jordan et al. | ......... | 438/94 |
| 4,331,707 A * | 5/1982 | Muruska et al. | ......... | 438/95 |
| 4,360,542 A * | 11/1982 | Loeffler et al. | ......... | 427/75 |
| 4,612,411 A * | 9/1986 | Wieting et al. | ......... | 136/265 |
| 4,647,711 A * | 3/1987 | Basol et al. | ......... | 136/256 |
| 5,032,374 A | 7/1991 | Pastor et al. | | |
| 5,202,290 A | 4/1993 | Moskovits | | |
| 5,541,118 A * | 7/1996 | Levi et al. | ......... | 438/94 |
| 5,674,325 A * | 10/1997 | Albright et al. | ......... | 136/250 |
| 5,728,231 A | 3/1998 | Negami et al. | | |
| 5,868,869 A * | 2/1999 | Albright et al. | ......... | 136/250 |
| 6,303,097 B1 | 10/2001 | Kinsman et al. | | |
| 7,017,382 B2 | 3/2006 | Segal et al. | | |
| 7,482,059 B2 | 1/2009 | Peng et al. | | |
| 7,704,914 B2 | 4/2010 | Tohji et al. | | |
| 2003/0011047 A1* | 1/2003 | Cunningham et al. | ......... | 257/614 |
| 2005/0186342 A1 | 8/2005 | Sager et al. | | |
| 2006/0057766 A1* | 3/2006 | Jia et al. | ......... | 438/85 |

OTHER PUBLICATIONS

Xuanzhi Wu, High-efficiency polycrystalline CdTe thin-film solar cells, Solar Energy, vol. 77, Issue 6, Thin Film PV, Dec. 2004, pp. 803-814, ISSN 0038-092X.*

B. E. McCandless, A. Mondal, R. W. Birkmire, Galvanic deposition of cadmium sulfide thin films, Solar Energy Materials and Solar Cells, vol. 36, Issue 4, Apr. 1995, pp. 369-379, I.*

K.S. Balakrishnan, A.C. Rastogi; "Structure and growth kinetics of electrodeposited Cds thin films for solar cell applications", Solar Energy Materials, Published by Elsevier B.V., Jun. 1990, vol. 20, Issues 5-6, pp. 417-434.

Jichun Fan, Tao Gao, Guowen Meng, Yewu Wang, Xiong Liu, Lide Zhang; "Synthesis of CdS nanowires by sulfurization", Materials Letters, Elsevier Science B.V., Dec. 2002, vol. 57, pp. 656-659.

* cited by examiner

*Primary Examiner* — Jarrett Stark
(74) *Attorney, Agent, or Firm* — Paul J. DiConza

(57) ABSTRACT

A method for making a cadmium sulfide layer is provided. The method includes a number of steps including providing a substrate and disposing a layer containing cadmium on the substrate followed by sulfurization of the cadmium-containing layer.

20 Claims, 3 Drawing Sheets

METHOD FOR MAKING CADMIUM SULFIDE LAYER

BACKGROUND

The invention relates generally to a method of making cadmium sulfide. In particular, the invention relates to method of making cadmium sulfide layers used, for example, in a photovoltaic cell or a solar cell.

Solar energy is abundant in many parts of the world year round. Unfortunately, the available solar energy is not generally used efficiently to produce electricity. For example, a typical solar cell achieves a conversion efficiency of less than about 20 percent. The cost of conventional photovoltaic cells, and electricity generated by these cells, is generally very high. Moreover, photovoltaic cells typically include multiple layers formed on a substrate, and thus solar cell manufacturing typically requires a significant number of processing steps. As a result, the high number of processing steps, layers, interfaces, and complexity increase the amount of time and money required to manufacture these cells. Researchers are continually striving to improve the efficiency and reduce the production costs of the photovoltaic (PV) cells.

A typical polycrystalline thin film PV cell has a very thin (less than 0.1 micron) layer called the "window" layer. The window layer's role is to form a heterojunction in combination with an absorber layer. The window layer desirably is thin enough and has a wide enough bandgap (2.4 eV or more) to let most available light through to the absorber layer. For CIGS and CdTe type solar cells, the most common material for the window layer is cadmium sulfide (CdS). Cadmium sulfide is a direct bandgap semiconductor and has many other applications, for example in light detectors and photoresistors.

Various methods have been used to deposit CdS thin films, for example chemical bath deposition, sol-gel, electrochemical deposition, thermal evaporation, sputtering, and spraying. However, most of these methods are prohibitively expensive and/or complicated and thus could not be used to produce thin films in large quantities for reasonable cost.

Accordingly, there remains a need for more efficient and less expensive methods of fabricating thin films of cadmium sulfide for large-scale production.

BRIEF DESCRIPTION OF THE INVENTION

Embodiments of the invention are directed towards a method for making a cadmium sulfide layer.

According to one embodiment of the invention, the method includes a number of steps including providing a substrate and disposing a layer containing cadmium on the substrate. The cadmium-containing layer is then sulfurized to substantially transform the cadmium to cadmium sulfide.

DRAWINGS

These and other features, aspects, and advantages of the present invention will become better understood when the following detailed description is read with reference to the accompanying drawings, wherein.

DETAILED DESCRIPTION

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

In the following specification and the claims, the singular forms "a", "an" and "the" include plural referents unless the context clearly dictates otherwise. The terms "comprising," "including," and "having" are intended to be inclusive and mean that there may be additional elements other than the listed elements. Moreover, the use of "top," "bottom," "above," "below," and variations of these terms is made for convenience, but does not require any particular orientation of the components unless otherwise stated. As used herein, the terms "deposited on" or "deposited over" refers to both secured or disposed directly in contact with and indirectly by having intervening layers there between.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances the event or capacity cannot occur—this distinction is captured by the terms "may" and "may be".

The term "transparent", as used herein, means that a material allows the passage of a substantial portion of incident solar radiation. The substantial portion may be at least about 80% of the incident solar radiation.

Quite generally, in the interest of brevity of the discussions herein, a photovoltaic (PV) cell including cadmium telluride (CdTe) as an absorber layer may be referred to as a "CdTe PV cell" and those including $Cu(In,Ga,Al)(Se,S)_2$ (CIGS) may be referred to as "CIGS PV cells." Other examples of PV cells may include a copper-zinc-tin-sulfide (CZTS) PV cell and a metal sulfide PV cell.

Figure 1:
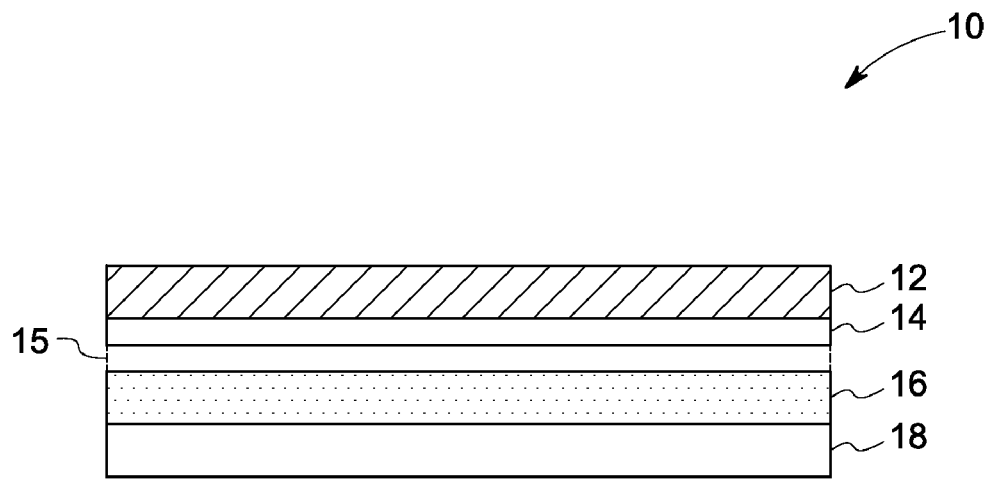
FIG. 1 illustrates a schematic of a photovoltaic device, according to an illustrative embodiment of the present invention.

A photovoltaic cell generally includes a substrate, a transparent electrode, a CdS window layer, an absorber layer, and a base electrode. FIG. 1 illustrates a CdTe PV cell 10 that includes a transparent substrate 12. The substrate 12 includes a transparent conductive layer 14 that forms the transparent electrode. The CdS window layer 16 is deposited on the transparent conductive layer 14 followed by the absorber layer 18.

The transparent conductive layer 14 (also referred to as TCO layer when the layer includes an oxide) is disposed on a surface of the substrate 12. Suitable materials for the transparent conductive layer 14 may include an oxide, sulfide, phosphide, telluride, or combinations thereof. These transparent conductive materials may be doped or undoped. In an illustrative embodiment, the transparent conductive layer 14 may include an oxide, such as titanium dioxide, silicon oxide, zinc oxide, tin oxide, aluminum doped zinc oxide, fluorine-doped tin oxide, cadmium stannate (cadmium tin oxide), or zinc stannate (zinc tin oxide). In another embodiment, the transparent conductive layer 14 includes one or more indium-containing oxides. Some examples of suitable indium containing oxides are indium tin oxide (ITO), Ga—In—Sn—O, Zn—In—Sn—O, Ga—In—O, Zn—In—O, and combinations thereof. Suitable phosphides may include indium phosphide, gallium phosphide, and the like.

An optional secondary transparent conductive layer 15 with higher sheet resistance than that of the transparent conductive layer 14 may be disposed over the transparent conductive layer 14. This secondary transparent conductive layer 15 is known as high-resistance transparent (HRT) layer or high-resistance transparent conductive layer. Undoped zinc stannate ($ZnSnO_4$), zinc oxide (ZnO), and tin oxide ($SiO_2$) may be employed as the HRT layer. The HRT layer usually permits the use of a thinner CdS window layer in a photovoltaic cell than is feasible without the HRT layer, thereby increasing the quantum efficiency of the cell in the blue region. The HRT layer may also improve the cell efficiency by forming a barrier against diffusion of unwanted species from the substrate 12 and a front contact to the CdS window layer 16.

Figure 2:
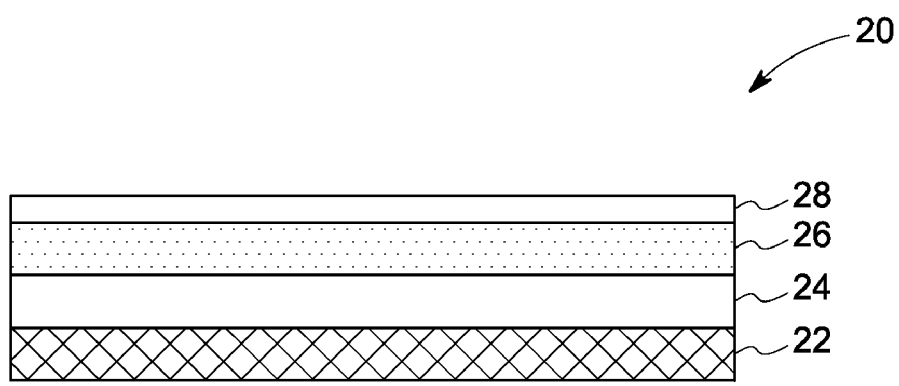
FIG. 2 illustrates a schematic of a photovoltaic device, according to another illustrative embodiment of the present invention.

FIG. 2 shows an illustrative embodiment of a CIGS PV cell or a copper-zinc-tin-sulfide (CZTS) PV cell. The cell 20 includes a substrate 22 that may be non-transparent. A non-transparent layer 24 is disposed on the substrate 22 to form the absorber layer and a CdS window layer 26 is deposited over the non-transparent layer 24. A transparent conductive layer 28 may be disposed on the window layer 26. In these instances, the non-transparent layer 24 includes one or more elements selected from the group consisting of copper, silver, indium, gallium, aluminum, zinc, tin and selenium. In a specific embodiment, the non-transparent layer includes copper.

A photoactive material is typically used for forming an absorber layer. Examples of suitable photoactive materials may include cadmium telluride (CdTe), $Cu(In,Ga,Al)(Se,S)_2$ (CIGS) and copper-zinc-tin-sulfide (CZTS). In some instances, these materials may further be substituted with one or more additional elements.

There are a number of ways to deposit CdS thin films. One way of producing CdS films is by spraying a solution of a cadmium salt and a soluble sulfide. Cadmium sulfide is thus formed by a double decomposition reaction in situ on the substrate. See, for instance, U.S. Pat. No. 4,159,914. Another spraying technique involves chemical spray deposition of an oxide film of cadmium, followed by treatment of the oxide film with hydrogen sulfide, reactive therewith to produce cadmium sulfide. See, for instance, U.S. Pat. No. 4,242,374. The cadmium oxide film is obtained by spray deposition and thermal decomposition of a soluble cadmium salt, such as cadmium nitrate, cadmium oxalate, or cadmium acetate. These processes are complicated, and difficult to control. A double decomposition condensation, or similar reaction of two chemicals in situ to produce one or several different chemicals, depends upon relative proportions of the chemicals, their concentrations, the reaction temperature and the reaction time.

Moreover, the most commonly used method of producing CdS thin films is by sputtering from a CdS target, which is an extremely expensive material. Sputtering is a well-known and widely used technique for efficient and large-scale coatings. However, sputtering from a CdS target is slow and expensive in bill of material cost.

Figure 3:
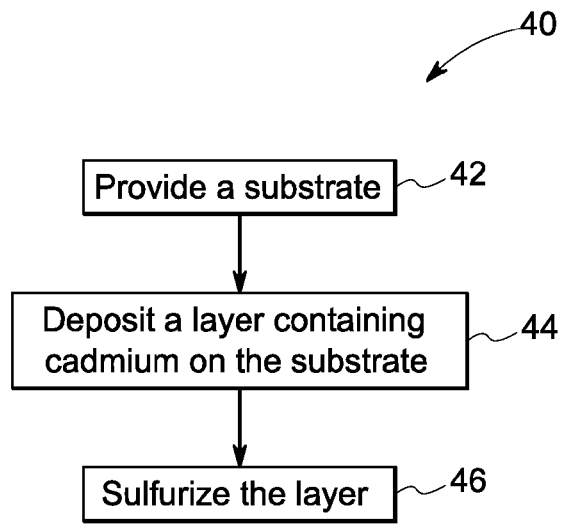
FIG. 3 illustrates a flow diagram of a method to make cadmium sulfide layer in accordance with some embodiments of the present invention.

Embodiments of the invention described herein provide an alternative method to address the noted shortcomings of the state of the art. The method of making a cadmium sulfide layer includes steps in the sequence as illustrated in flow diagram 40 of FIG. 3, according to one embodiment of the invention. Step 42 provides a substrate. Substrate selection depends on desired application, for example type of PV cell.

Suitable examples of substrate material may include, but are not limited to, glass, semiconductor, doped semiconductor, amorphous dielectrics, crystalline dielectrics, metal, polymer and combinations thereof. In certain embodiments, the substrate is a glass plate. In certain other embodiments, the substrate is a flexible polyimide. In yet other embodiments, the substrate includes a metal.

The substrate, in some embodiments, has a substantially planar surface. A "substantially planar surface", as defined herein, usually refers to a substantially flat surface. The surface can be smooth, although it may include a relatively minor degree (e.g., an RMS roughness that is less than about 1 micron, or more specifically less than about 300 nm) of texture, indentations, and various irregularities.

Figure 4:
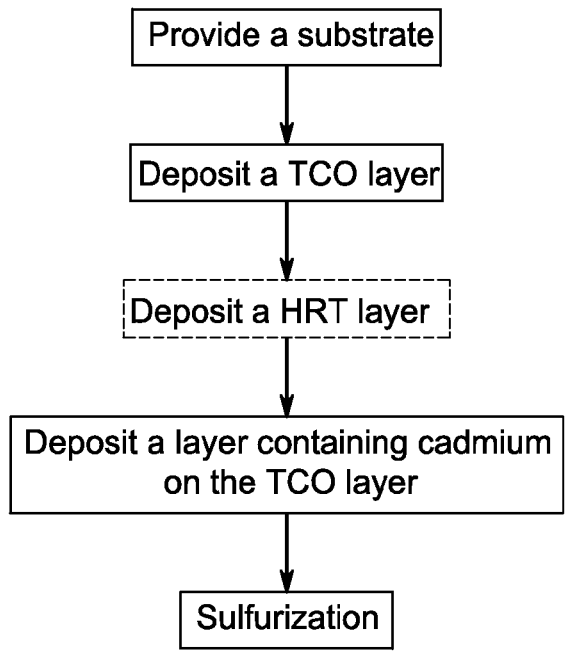
FIG. 4 illustrates a flow diagram of a method to make cadmium sulfide layer in accordance with an illustrative embodiment of the present invention.
Figure 5:
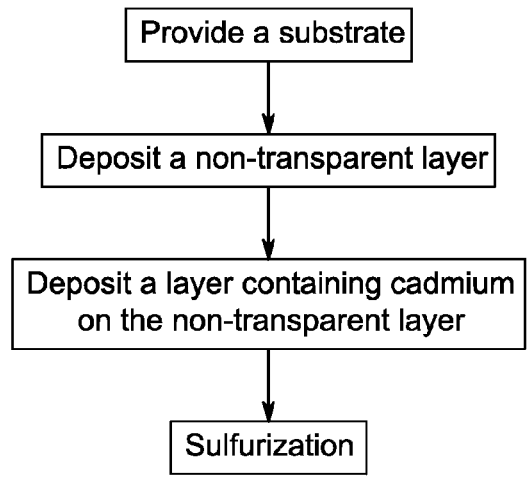
FIG. 5 illustrates a flow diagram of a method to make cadmium sulfide layer in accordance with another illustrative embodiment of the present invention.

The method 40 further includes the step 44 of disposing a cadmium-containing layer on the substrate. In specific embodiments, the layer includes cadmium metal. In some embodiments, the cadmium-containing layer is deposited over the transparent conductive layer 14, as shown in FIG. 1 and depicted in flow diagram of FIG. 4. In these instances, if a HRT layer is employed, the cadmium-containing layer is deposited over the HRT layer 15. In some other embodiments, the cadmium-containing layer is deposited over the non-transparent layer 24 as shown in FIG. 2 and depicted in flow diagram of FIG. 5.

Various thin-film deposition techniques can be used to deposit the cadmium-containing layer, for example chemical bath deposition, sol-gel, electrochemical deposition, thermal evaporation, sputtering, and spraying. According to some embodiments of the present invention, a vacuum deposition technique is used to attain a high quality film. Non-limiting examples of vacuum deposition technique include evaporation deposition, electron beam physical vapor deposition, sputter deposition, cathode arc deposition, or pulsed laser deposition. In certain embodiments, sputtering is a desirable deposition technique for the deposition of high quality films over large areas, in simple and controllable way.

Figure 6:
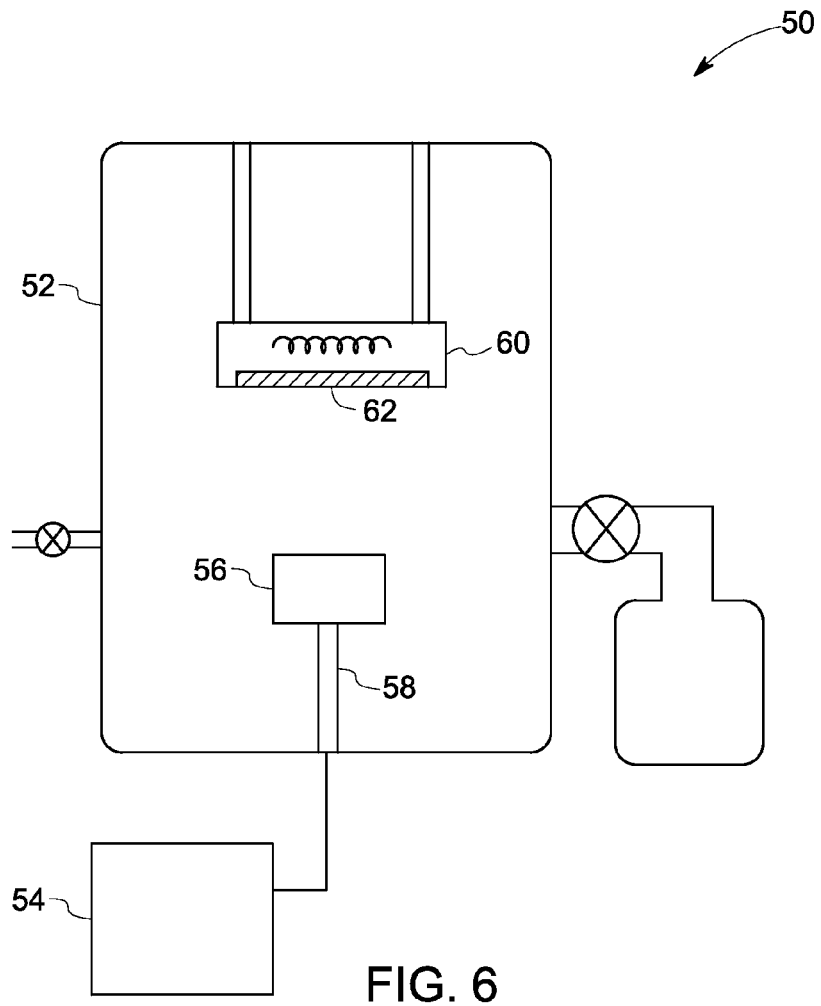
FIG. 6 illustrates a schematic cross sectional view of a chamber suitable for sputter deposition in accordance with some embodiments of the present invention.

FIG. 6 illustrates an example of a sputtering system 50. Sputtering system 50 typically includes a vacuum chamber 52. A sputtering source 56 is connected to a power source 54 and includes a sputter gun and a target (not shown) for sputtering operations. The power source 54 may be a direct current (DC), a radiofrequency (RF) power, a bipolar pulsed direct current, a high power pulsed direct current or any combination thereof. The sputtering source 56 is mounted on a support 58 extending into the vacuum chamber 52. According to one embodiment of the invention, the target includes cadmium metal.

The sputtering system 50 utilizes an atmosphere of gas having heavy ions, such as argon. A substrate holder 60 supports a substrate 62, which is typically held in an orientation and at distance suitable for film growth. The substrate 62 may be heated. To deposit a layer of cadmium metal, the substrate 62 is placed in the chamber 52 for about 10 to about 90 minutes, depending on desired thickness of the layer.

The thickness of desired cadmium sulfide (CdS) layer is typically required to be minimized in a PV cell to achieve high efficiency. In some embodiments, the thickness of the cadmium-containing layer may be between about 10 nanometers and about 200 nanometers depending in part on the sputtering time. In certain embodiments, the thickness of the layer ranges from about 50 nanometers to about 100 nanometers. In some embodiments, the cadmium metal may be deposited using an in-line system with multiple sputtering sources.

The method 40 further provides step 46 for sulfurization of the cadmium-containing layer. As used herein, "sulfurization" refers to exposing the cadmium-containing layer in a sulfur-containing atmosphere to substantially transform the cadmium to cadmium sulfide. In one embodiment, the sulfur-containing atmosphere includes a sulfur-containing gas. Suitable examples of sulfur-containing gas include, but are not limited to, hydrogen sulfide, carbon disulfide, sulfur hexafluoride ($SF_6$), sulfur dichloride, alkane thiols, and thioethers. Other examples may include organometallic precursors, although these species may leave undesirable organic residues after the process.

Moreover, sulfurization occurs below a temperature at which the formed sulfide decomposes or sublimes. Thus, sulfurization of the cadmium-containing layer is carried out in a temperature range of about 100 degrees Celsius to about 1000 degrees Celsius. In certain instances, the sulfurization temperature ranges from about 200 degrees Celsius to about 500 degrees Celsius. Transformation of the cadmium-containing layer to cadmium sulfide layer depends in part on the thickness of the layer, the sulfurization time, and the temperature selected. In some embodiments, sulfurization of the cadmium-containing layer is carried out for a period ranging of about 2 minutes to about 5 hours, and in certain embodiments, about 5 minutes to about 30 minutes.

The sulfurization time and sulfurization temperature are selected to convert at least about 50% of the cadmium in the cadmium-containing layer to cadmium sulfide (CdS). In some embodiments, at least about 80% of cadmium, and in some embodiments, substantially all of the cadmium is converted to cadmium sulfide.

In one embodiment, the sulfurization of the cadmium-containing layer may be carried out inside the vacuum chamber after deposition of the layer, for example to avoid oxidization of cadmium. However, in another embodiment, the sulfurization of the cadmium-containing layer may be accomplished outside the vacuum chamber, for example to avoid contamination of the vacuum chamber. The cadmium-containing layer may be shifted to another region or zone of the vacuum chamber after deposition to carry out sulfurization.

In some embodiments, for example in CIGS or CZTS PV cells, the cadmium-containing layer is disposed on the non-transparent layer. In these instances, the non-transparent layer and the cadmium-containing layer are both sulfurized at the same time to form the photoactive material layer and cadmium sulfide layer, respectively.

In some embodiments, a certain amount of oxygen can be incorporated in the cadmium-containing layer to form a CdS:O film after sulfurization. In these particular instances, the oxygen content is usually greater than about 1 atomic percent and less than about 50 atomic percent in the cadmium-containing layer. In certain embodiments, the oxygen content may vary between about 1 atomic percent and about 45 atomic percent, and more specifically, between about 2 atomic percent and about 20 atomic percent.

The above-discussed method advantageously provides a relatively economic process to deposit a cadmium sulfide layer as compared to currently available methods. The method is relatively economical with respect to both cost and time. Sputtering cadmium sulfide (CdS) is difficult and takes a long time due to slow growth rates, when compared with sputtering metallic cadmium. Furthermore, CdS targets are relatively expensive compared to metallic cadmium targets. The present method thus saves time and materials cost compared to conventional deposition of CdS.

The above-described process/method of making cadmium sulfide layer can be very easily exploited for industrial production line.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of making a cadmium sulfide layer, the method comprising the steps of:
   providing a substrate,
   disposing a layer of cadmium metal on the substrate,
   incorporating oxygen into the cadmium layer, and
   sulfurizing the cadmium layer to substantially transform cadmium to cadmium sulfide to form an oxygen-containing cadmium sulfide (CdS:O) layer.

2. The method of claim 1, wherein the substrate comprises glass.

3. The method of claim 1, wherein the substrate comprises a transparent conducting layer disposed on a surface of the substrate.

4. The method of claim 3, wherein the transparent conductive layer comprises an oxide, a sulfide, a phosphide, a telluride, or combinations thereof.

5. The method of claim 3, wherein the substrate further comprises a high-resistance transparent (HRT) layer disposed on the transparent conducting layer.

6. The method of claim 5, wherein the high-resistance transparent layer comprises zinc oxide, tin oxide or a combination thereof.

7. The method of claim 3, wherein the cadmium layer is deposited on the transparent conducting layer.

8. The method of claim 1, wherein the substrate comprises a non-transparent layer.

9. The method of claim 8, wherein the non-transparent layer comprises one or more element selected from the group consisting of copper, silver, indium, gallium, aluminum, zinc, tin and selenium.

10. The method of claim 8, wherein the cadmium layer is disposed on the non-transparent layer.

11. The method of the claim 1, wherein the cadmium layer is disposed by a vacuum deposition technique selected from the group consisting of evaporation deposition, electron beam physical vapor deposition, sputter deposition, cathode arc deposition and pulsed laser deposition.

12. The method of claim 1, wherein the CdS:O layer has a thickness in a range of about 10 nm to about 200 nm.

13. The method of claim 12, wherein the CdS:O layer has a thickness in a range of about 50 nm to about 100 nm.

14. The method of claim 1, wherein sulfurizing the cadmium layer comprises exposing the cadmium-containing layer to a sulfur-containing atmosphere.

15. The method of claim 14, wherein the sulfur-containing atmosphere comprises a gas selected from the group consisting of hydrogen sulfide, carbon disulfide, sulfur hexafluoride, sulfur dichloride, alkane thiols, and thioethers.

16. The method of claim 14, wherein sulfurization of the cadmium layer is carried out in a temperature range of about 100 degrees Celsius to about 1000 degrees Celsius.

17. The method of claim 16, wherein sulfurization of the cadmium layer is carried out in a temperature range of about 200 degrees Celsius to about 600 degrees Celsius.

18. The method of claim 14, wherein sulfurization of the cadmium layer is carried out for a period ranging of about 2 minutes to about 5 hours.

19. The method of claim 14, wherein sulfurization of the cadmium layer is carried out for a period ranging of about 5 minutes to about 30 minutes.

20. The method of claim 1, wherein the oxygen is present in an amount greater than about 1 atomic percent.

\* \* \* \* \*